United States Patent
Chang

(12) 
(10) Patent No.: US 6,316,056 B1
(45) Date of Patent: Nov. 13, 2001

(54) PROCEDURE FOR PRODUCING ISOLATION COPPER FACING MEMBRANE

(75) Inventor: Si-Chung Chang, Taipei (TW)

(73) Assignee: Helix Thechnology Inc., Hsin-Chu (TW)

( * ) Notice: Subject to any disclaimer, the term of this patent is extended or adjusted under 35 U.S.C. 154(b) by 0 days.

(21) Appl. No.: 09/390,656

(22) Filed: Sep. 7, 1999

(51) Int. Cl.$^7$ .................................................. B05D 3/00
(52) U.S. Cl. ................................. 427/296; 427/96
(58) Field of Search ......................... 427/96, 98, 99, 427/296

(56) References Cited

U.S. PATENT DOCUMENTS 5,346,730 * 9/1994 Kruck et al. ........................... 427/584
5,900,186 * 5/1999 Fakler et al. .......................... 252/79.1

* cited by examiner

*Primary Examiner*—Brian K. Talbot
(74) *Attorney, Agent, or Firm*—Rabin & Berdo, P.C.

(57) ABSTRACT

A method for producing isolation copper facing membranes, in which the basic material is the "polyimide" isolation membrane "KAPTON", includes the steps of: cleaning the "polyimide" isolation membrane "KAPTON" using a high pressure air stream to remove dust from the board; placing the board in a vacuum facing copper chamber, the pressure in the vacuum facing copper device should be kept at about $1\times10^{-3}$ Torr, and then Argon and Oxygen, at a ratio of 1:3, should be inserted; the vacuum pressure should then be adjusted to about $5\times10^{-3}$ Torr; facing copper is produced by spreading for 5 minutes, producing a thin CuO membrane on the "polyimide" isolation membrane "KAPTON"; the CuO membrane on the "polyimide" isolation membrane is placed into another vacuum with only Argon and the pressure is maintained at about $1\times10^{-3}$ Torr.

3 Claims, No Drawings

PROCEDURE FOR PRODUCING ISOLATION COPPER FACING MEMBRANE

FIELD OF THE INVENTION

The present invention involves the manufacturing process isolation copper facing membranes, particulary a manufacturing process for facing copper on a polyimide isolation membrane in a vacuum while controlling the thickness of copper facing.

BACKGROUND OF THE INVENTION

Generally the material for printed circuit board have to be very soft and bendable. The necessary kinds of materials are widely use for notebook computers, electric translator and similar products. Presently, in the fields of such related products industrial most materials which are used for printed circuit boards include the polyimide isolation membrane "KAPTON" which made by DuPont Company, and a thin copper foil is added on top of it. The must be carved very carefully when put on the board. Also, the strength of attachment is extremely important. Besides the strength of attachment, the glue material is also a very important factor which may reduce the quality of the printed circuit board. Presently most attachment glues for printed circuit boards are imported, and the price is very high for domestic manufacture. The cost and quality for such attachment glues is a quite important problem for industrial nations, including Taiwan.

Therefore, the present invention includes a simpler and less costly manufacturing process for isolation copper facing membranes, especially a manufacturing process for facing copper on polyimide isolation membranes in a vacuum and further control the thickness of copper facing.

SUMMARY OF THE INVENTION

An object of the present invention is to provide an improved manufacturing process for copper facing, thus providing a whole new manufacturing process for isolation copper facing membranes. The invention not only avoids slippage of components but also reduces the cost for attachment glues.

DETAILED DESCRIPTION OF THE INVENTION

The conventional way for printed circuit board to have facing metal on it is to stick the metal to the board with glue or paste. Most printed circuit boards include the "polyimide" isolation membrane "KAPTON" which can be bend and is a very soft thin board. After processing, the membranes are used for notebook computers, electric translators and other such products. The very complicated printed circuit is then carved on the copper foil, so the copper foil must be placed very carefully on the board. Also, the strength of attachment is extremely important. Further to the strength of attachment, the glue material a very important factor which may improve or reduce the quality of the printed circuit board. Presently, most attachment glues for printed circuit boards are imported from other countries, and the price is very high for the producing companies. Thus the cost and quality of the attachment glues is a quite important issue for manufacturers.

The present invention for providing facing copper on the isolation membrane is to dispose facing copper by a spreading method. After sweeping and cleaning the base material, the material is placed in a vacuum for producing facing copper by a spreading method. The material is the "polyimide" isolation membrane "KAPTON" which can bend and is a very soft thin board. The method further includes the following steps:

(A) The "polyimide" isolation membrane "KAPTON" is cleaned and swept by high pressure air removing dust particles from the board and then the material is placed in a vacumm facing copper device;

(B) The vacumm facing copper device operates at a pressure of about $1 \times 10^{-3}$ Torr, and then are inserted into the vacumm Argon and Oxygen ,the ratio for Argon and Oxygen should be around 1:3, and at this time the intensity for the vacumm facing copper device have a pressure of about $5 \times 10^{-3}$ Torr for a full 5 minutes;

(C) The ratio for Argon and Oxygen should be adjusted to be around 1:1, the pressure for the vacumm the copper device should be maintained at about $5 \times 10^{-3}$ Torr, and facing copper spreading should continue for 5 minutes; and then there will be a thin CuO membrane on the "polyimide" isolation membrane "KAPTON";

(D) With a thin CuO membrane on the "polyimide" isolation membrane "KAPTON"; the "KAPTON" is placed in another copper facing chamber with only Argon placed in the chamber as well, and the pressure for the vacumm facing copper device is kept at to keep about $1 \times 10^{-3}$ Torr, and use the same method to and facing copper by spreading completely.

(E) The procedure is completed now.

The present invention produces facing copper by direct spreading directly on the "polyimide" isolation membrane "KAPTON", and does not have to use glue or paste, and therefore does not have to consider the problems associated with paste or glue in this context. Furthermore, to use spreading way to face copper on the material is better than to glue or paste ways.

The embodiment mentioned above is only a better example to embody the present invention and can not restrict the range of embodiment of the present invention to it. Any modification or change made based on the present invention shall be considered to be within coverage of the present invention.

What is claimed is:

1. A method for producing isolation copper facing membranes, said method comprising the steps of:

removing dust particles from a polyimide isolation membrane;

placing said polyimide isolation membrane in a vacuum at a pressure of $1 \times 10^{-3}$ Torr;

inputting argon and oxygen at a ratio of 1:3, and increasing the vacuum pressure to $5 \times 10^{-3}$;

adjusting the argon and oxygen ratio to about 1:1;

for about 5 minutes, while maintaining the argon and oxygen ratio at about 1:1 and the vacuum pressure at around $5 \times 10^{-3}$ Torr, spreading copper on the membrane, to form a layer of CuO; and placing said polyimide isolation membrane in another vacuum chamber, inserting argon with no oxygen therein and maintaining a vacuum pressure of $1 \times 10^{-3}$ Torr to form a layer of Cu on top of the layer of CuO.

2. The method according to claim 1, wherein said polyimide isolation membrane includes the product "KAPTON".

3. A method according to claim 1, wherein said step of removing dust particles from said polyimide isolation membrane is performed by applying a high pressure air stream thereto.

* * * * *